United States Patent
Luebke et al.

[19]

[11] Patent Number: 5,877,618
[45] Date of Patent: Mar. 2, 1999

[54] HAND HELD NON-CONTACT VOLTAGE TESTER

[75] Inventors: Thomas M. Luebke, Menomonee; David L. Wiesemann, Pewaukee, both of Wis.

[73] Assignee: Applied Power, Inc., Butler, Wis.

[21] Appl. No.: 903,575

[22] Filed: Jul. 31, 1997

[51] Int. Cl.⁶ .................... G01R 19/155; G01R 31/02
[52] U.S. Cl. .................. 324/72.5; 324/556; 324/133; 340/815.73
[58] Field of Search .................... 324/555, 556, 324/72.5, 133, 149; 340/635, 328, 332, 815.4, 815.73, 384.7

[56] References Cited

U.S. PATENT DOCUMENTS

| | | | |
|---|---|---|---|
| D. 214,755 | 7/1969 | McPhee | D52/6 |
| D. 222,138 | 10/1971 | Palmer et al. | D26/1 |
| D. 243,717 | 3/1977 | Edmark et al. | D83/1 |
| D. 266,270 | 9/1982 | Sugawara et al. | D24/17 |
| D. 287,473 | 12/1986 | Ueno | D10/57 |
| D. 299,318 | 1/1989 | Chiang | D10/78 |
| D. 342,087 | 12/1993 | Mear et al. | D19/36 |
| D. 342,088 | 12/1993 | Sonntag et al. | D19/48 |
| D. 351,562 | 10/1994 | Moffatt et al. | D10/78 |
| D. 371,747 | 7/1996 | Strader | D10/78 |
| 2,476,115 | 7/1949 | Runbaken | 175/183 |
| 2,536,577 | 1/1951 | Simmons et al. | 175/183 |
| 3,822,598 | 7/1974 | Brothers et al. | 73/362 |
| 3,826,981 | 7/1974 | Ross | 324/72.5 |
| 3,919,631 | 11/1975 | Brown | 324/556 |
| 3,944,921 | 3/1976 | Tsuda et al. | 324/133 |
| 3,962,630 | 6/1976 | Chaffee | 324/508 |
| 4,006,409 | 2/1977 | Adams | 324/510 |
| 4,152,639 | 5/1979 | Chaffee | 324/72.5 |
| 4,527,118 | 7/1985 | Koslar | 324/133 |
| 4,533,864 | 8/1985 | Austin | 324/508 |
| 4,724,382 | 2/1988 | Schauerte | 324/133 |
| 4,859,932 | 8/1989 | Whitley | 324/72.5 |
| 5,103,165 | 4/1992 | Sirattz | 324/133 |
| 5,363,045 | 11/1994 | Martin et al. | 324/72.5 X |
| 5,430,604 | 7/1995 | Wong | 324/72.5 X |

FOREIGN PATENT DOCUMENTS

AU-B-53189/86  8/1986  Australia.

OTHER PUBLICATIONS

FCB International Co., Walnut Creek, Cal., brochure entitled "Electric Finder", undated.

*Primary Examiner*—Glenn W. Brown
*Attorney, Agent, or Firm*—Quarles & Brady

[57] ABSTRACT

A non-contact voltage tester has a self-test feature so that when a switch clip of the tester is actuated, light and sound indicator devices are energized to give a single blink and beep, respectively, following which the tester is ready for probing for a voltage. The light and sound indicator devices also indicate the presence of a voltage when the switch is actuated and a voltage is detected at the probe tip of the tester.

3 Claims, 4 Drawing Sheets

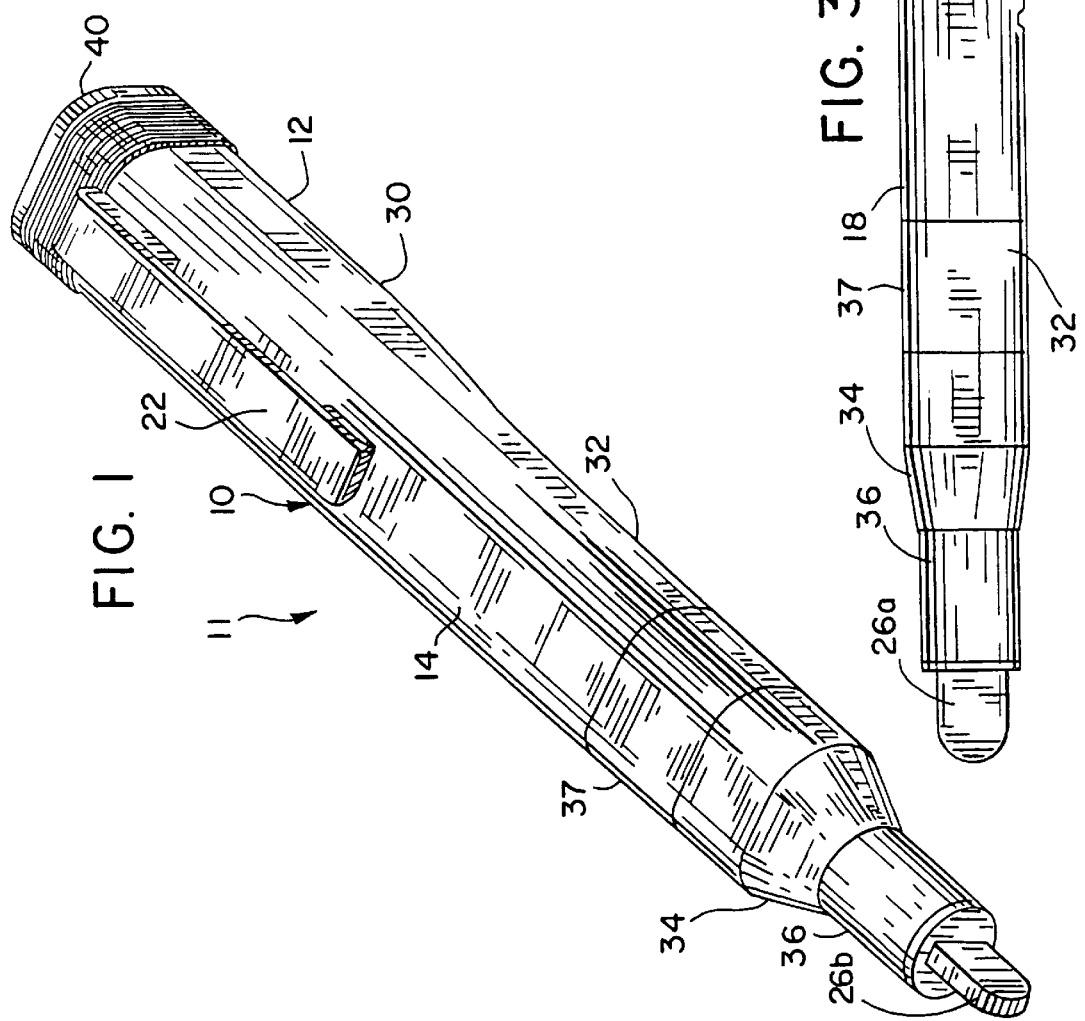

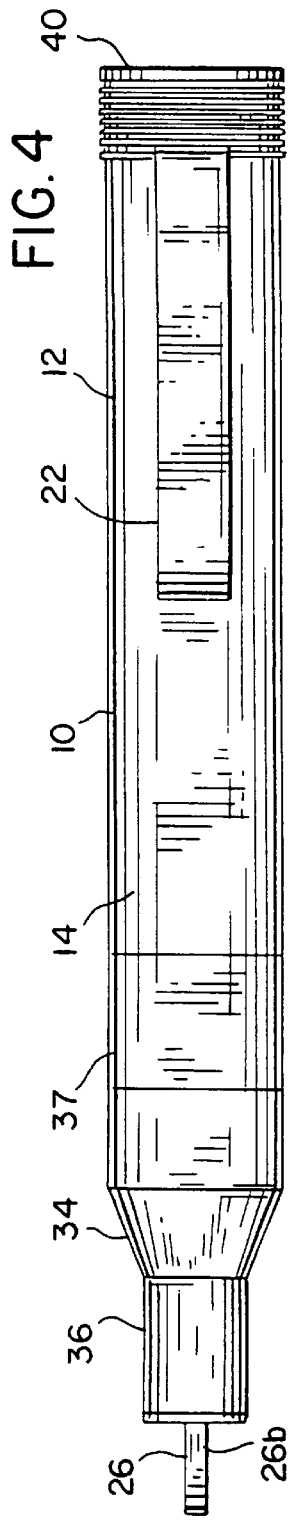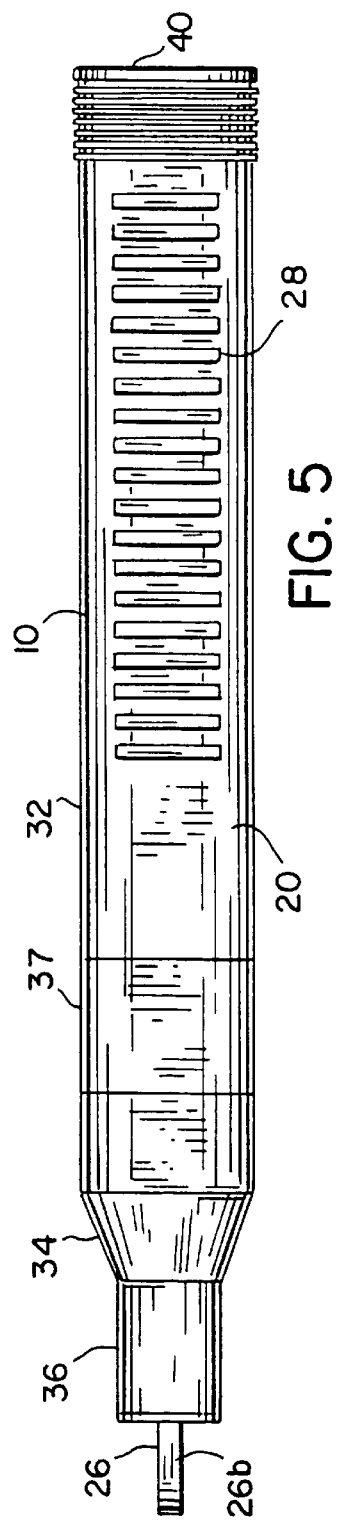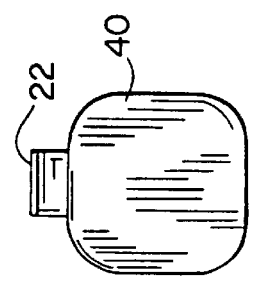

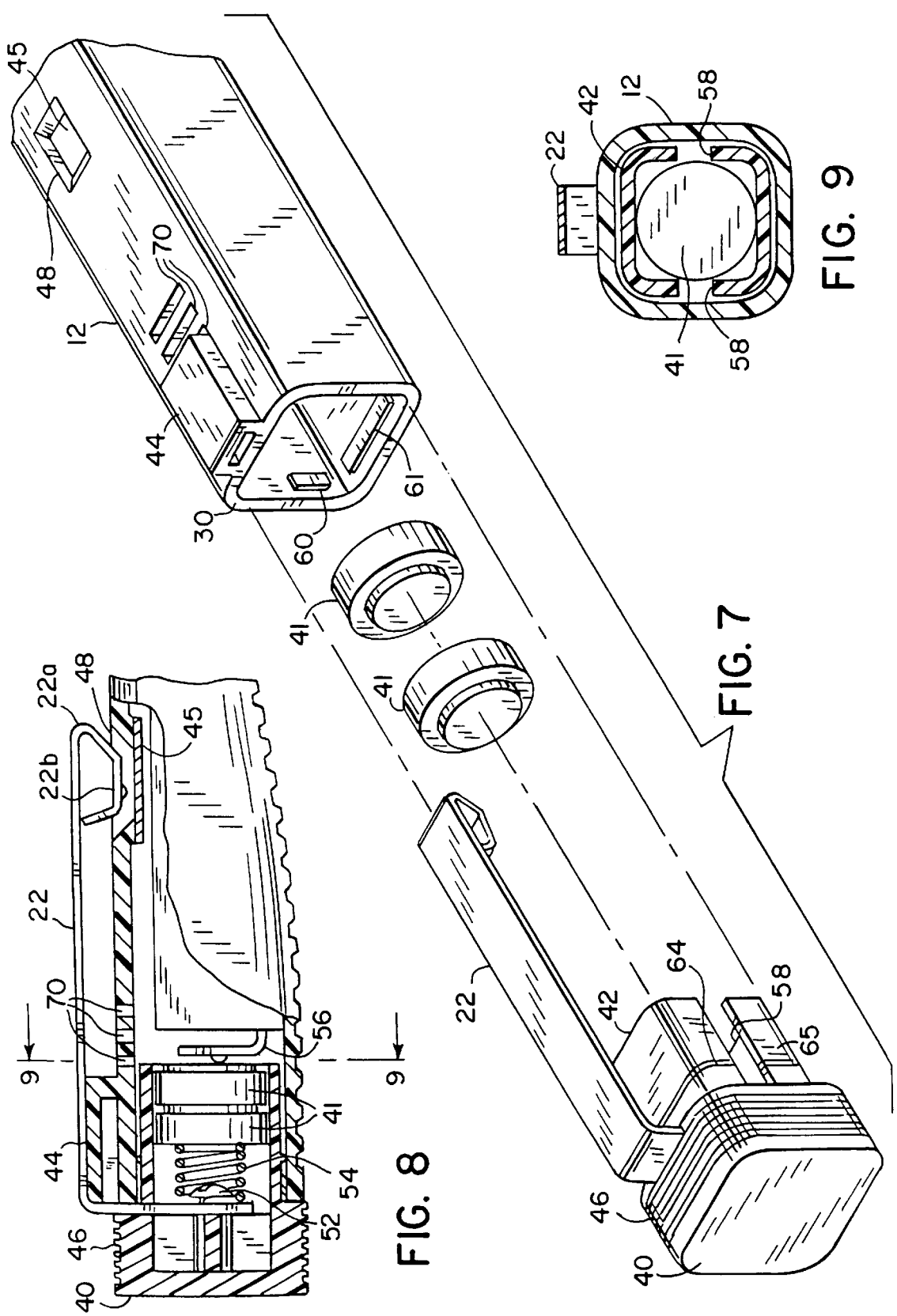

HAND HELD NON-CONTACT VOLTAGE TESTER

CROSS-REFERENCE TO RELATED APPLICATIONS

Not applicable

STATEMENT REGARDING FEDERALLY SPONSORED RESEARCH OR DEVELOPMENT

Not applicable

BACKGROUND OF THE INVENTION

This invention relates to hand held non-contact voltage testers, and particularly to such a device with a combination of features which facilitates the use of the device.

Hand held non-contact voltage testers of the type to which the present invention relates are well known. For example, they are shown in U.S. Pat. Nos. 3,822,598; 3,919,631 and 5,103,165. Such devices are typically pen-like pocket held and battery operated, and have a number of uses.

Such devices are used to detect whether a voltage is present at the location or wire being probed. If there is a voltage present, the device either lights and/or an alarm sounds off, repeatedly or continuously for as long as the probe tip is held in the vicinity of the voltage, to signal the operator that a voltage is present. Knowing a voltage is present, the operator will exercise caution around the location or handling the wire, or will turn the voltage off, for example at a circuit breaker panel.

If a location or wire is probed and the device does not light up or sound off, the operator may assume there is no voltage present and may exercise less caution than if a voltage was indicated. In fact, there may be a voltage present, and the reason for the device not indicating the voltage is that the batteries are dead, or the light or sound indicating device are non-operational.

Therefore, there is a need for a non-contact voltage tester which gives the operator an indication of whether it is operable.

BRIEF SUMMARY OF THE INVENTION

The invention provides a non-contact voltage tester of the above-described type but in which the voltage indicating device emits a signal of limited duration to the operator when a switch for turning on the tester is first actuated by the user in the absence of a voltage detected at the probe tip. This tells the operator that the batteries and indicating device, which may be a light source, a sound source, or both, are working. Thus, the invention provides a non-contact voltage tester with a self-test feature, which makes it easier to interpret the signal or lack of signal outputted by the tester.

These and other objects and advantages of the invention will be apparent from the description which follows. In the detailed description below, a preferred embodiment of the invention will be described and referenced in connection with the accompanying drawings. This embodiment does not represent the full scope of the invention. Rather, the invention may be employed in other embodiments and reference should therefore be made to the claims herein for interpreting the breadth of the invention.

BRIEF DESCRIPTION OF THE DRAWINGS

FIG. 1 is a perspective view of an electrical testing device incorporating the invention;

FIG. 2 is a front elevational view thereof;

FIG. 3 is a right side elevational view thereof;

FIG. 4 is a top elevational view thereof;

FIG. 5 is a bottom elevational view thereof;

FIG. 6 is a rear elevational view thereof;

FIG. 7 is an exploded view of the end of the handle portion of the housing shown in the preceding Figures, illustrating the cap orientation with the batteries;

FIG. 8 is a partial view of the end portion of the handle shown in FIG. 7 with a portion broken away to illustrate an assembly of the parts;

FIG. 9 is a sectional view taken along line 9—9 of FIG. 8; and

DETAILED DESCRIPTION OF THE PREFERRED EMBODIMENT

Figure 10:
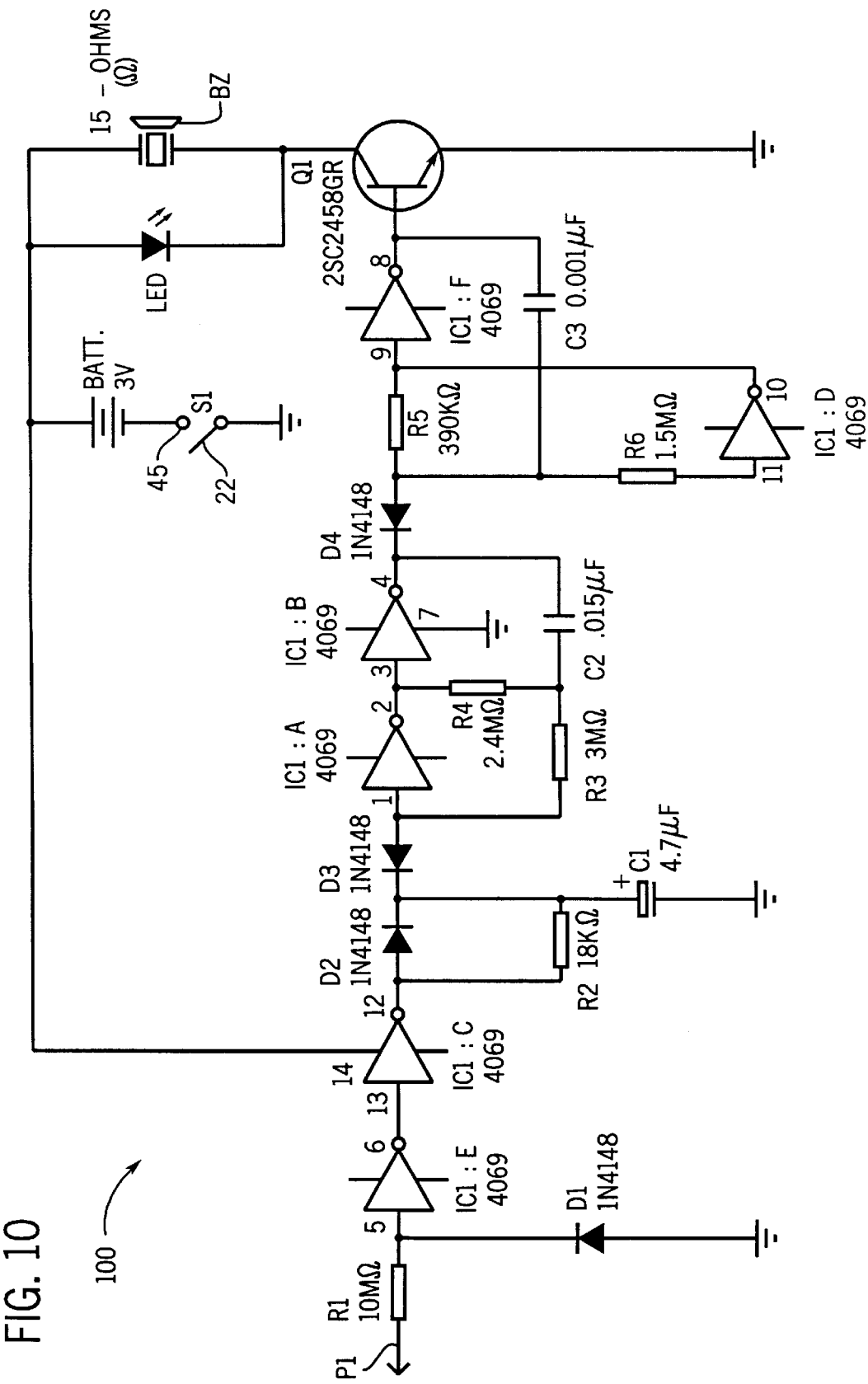
FIG. 10 is a schematic view of a circuit for a tester of the invention.

Referring to FIGS. 1–6, a housing 10 for an electrical testing device, generally 11, of the non-contact type includes a hollow handle portion 12 having a top wall 14, side walls 16 and 18 and a bottom wall 20. As seen specifically in FIG. 2, all of these walls are substantially flat in configuration to result in a handle having a rectangular, non-circular configuration.

Referring specifically to FIGS. 1 and 3, it is seen that the handle portion 12 has a large square portion 30 and a smaller rectangular portion 32. This is the result of the bottom wall 20 curving upwardly as shown at 24. This curved portion is positioned directly below the termination 22A of switch contact or clip member 22 and affords a finger gripping section for placement of one's fingers with the thumb placed on the contact member 22.

It is seen that the non-circular handle portion 12 has a larger square configuration 30 adjacent the clip member 22 and a smaller rectangular section 32 formed by the upwardly sloping curved portion 24. The smaller rectangular portion 32 includes a translucent (which may be transparent or only partially light transmissive) indicator light viewing window section 37, which is adhered to or molded as part of the remainder of the housing 10. Section 37 permits viewing an indicator light which is part of the tester circuit (FIG. 10) within the housing 10 from any point all the way around the tester 11.

Portion 32 blends into a transitional end section 34 which in turn is connected to a cylindrical portion 36 which leads to the probe tip 26 of the housing 10. The probe tip is a blade-like probe 26 which has wide flat sides 26a and narrow sides or edges 26b connecting the sides 26a along the top, bottom and front of the probe 26.

As best seen in FIG. 4, the sides 26a are at a right angle to the top wall 14 and clip member 22. This allows the probe 26 to be inserted into the vertical slot of an electric outlet plug without having to turn the handle 10 and while the user's hand is in a natural, at rest position, with the thumb up on top of the clip 22 and the bottom wall 24 resting on the index and other fingers.

Referring to FIGS. 7, 8 and 9, there is shown the orientation of the square cap 40 with the square housing portion 30. The cap 40 has a telescoping portion 42 with opposing slots 58 which allows it to flex so as to frictionally fit inside the end of the square housing portion 30. Molded-in ribs 60 (on both sides) and 61 (on the top and bottom) are for the purpose of affording a detente action with ridges 64 and 65 of cap 40. Note also that the cap 40 has hand gripping ribs 46 which allow for easy grasping.

Cap 40 houses the batteries 41 for energizing the voltage detector circuit (FIG. 10) contained in the handle portion 12. A spring 54 is retained in cap 40 by the screw 52, the spring 54 biasing the batteries against the contact 56. The screw 52 also connects the clip member 22 to the cap 40, as well as the spring 54, for electrical contact to the batteries 41. The clip member 22 extends from cap 40 over a support block 44 which is molded into the top wall 14, which prevents the member 22 from inadvertently contacting electrical contact 45 of the tester circuit (FIG. 10), but allows the clip 22 to be moved through the contact opening 48 in the top wall 14 to contact the contact terminal 45, so as to turn the tester on.

The probe tip 26 is aligned perpendicularly with the clip 22 and the top wall 14 which allows testing of an outlet circuit in a comfortable position of the hand, with control of the tester housing and without having to exert additional effort to orient the probe tip 26 with the opening in the outlet. The curved portion 24 immediately below the clip 22 gives a comfortable feel to the handle 10 when in this position. In addition, the orientation of the cap 40 with the handle body portion 30 by virtue of their rectangular configuration facilitates ease of battery replacement.

A cylindrical section 36 has been shown in conjunction with the tapering portion 34 with probe tip 26 extending therefrom, but this cylindrical portion could be eliminated or made non-circular. Also, while bar-like finger gripping portions 28 have been utilized in conjunction with the curved wall 24, other types of gripping surfaces could be employed such as raised surfaces of various geometric configurations. Additional discussion of the housing of the tester is given in U.S. patent application No. 08/904,041, entitled "Hand Held Non-Contact Voltage Tester Housing" of the same inventors and assignee and filed on the same date as this application, which is hereby incorporated by reference.

FIG. 10 illustrates an electrical circuit 100, having the elements and values as illustrated, for incorporation into the tester 11. The 3 volt battery power supply illustrated is provided in the form of the two pancake batteries 41 arranged in series, each of which is nominally 1.5 volts. The switch S1 illustrated is the clip member 22 and contact 45. The antenna P1 is a wire which extends into the probe tip 26. The LED illustrated is the light source which is mounted on the printed circuit board of the circuit 100 (which is mounted inside the housing 10) with the LED approximately centered in the window section 37. The LED preferably extends through a hole in the printed circuit board so that the light emitted by the LED is visible from both sides of the printed circuit board, as well as from the side edges of the printed circuit board, so that the light is visible for 360° around the longitudinal axis of the tester 11. The speaker BZ is positioned so as to project its beeping sounds through the openings 70 formed in the handle portion 12, under the clip 22. The LED blinks and the speaker BS intermittently beeps to indicate a voltage is present, when the clip 22 is depressed to contact terminal 45.

In addition, when the clip 22 is depressed to contact terminal 45 and held against the terminal 45, in the absence of a detected voltage, the LED blinks once and the speaker BZ beeps once when the clip 22 first contacts the terminal 45. This "self-test" feature tells the operator that the batteries have a sufficient charge to energize the LED and speaker BZ, and that the LED and speaker are operating. An operator can test these elements of the circuit 100 by depressing the clip 22 before and after probing for a voltage. Thus, when the operator goes to detect a voltage and the device 10 gives no indication of a voltage, the operator is assured that the absence of a voltage indication is not due to a lack of battery power, or to LED or speaker inoperability. The operator can therefore act accordingly, either to use another form of test for the voltage, for example as a double check if the expected magnitude of the voltage is high, or to treat the area or wire as being at ground potential.

While the preferred embodiment has been described above, it should be readily apparent to those skilled in the art that a number of modifications and changes may be made without departing from the spirit and scope of the invention. All such modifications are meant to be within the scope of the invention.

We claim:

1. In a non-contact voltage tester of the type having a single probe tip for sensing the presence of a voltage, an indicating lamp for signalling a user of the tester when said voltage is present, circuitry for detecting a voltage at said probe tip and operating said indicating lamp in response to said detected voltage, a battery power supply for energizing said circuitry and a switch actuated by the user of said tester for operatively connecting said power supply with said circuitry, the improvement wherein said indicating lamp emits a signal of limited duration to the operator when said switch is first actuated by the user in the absence of a voltage detected by said circuitry at said probe tip and said lamp is positioned inside a translucent section of a housing of said tester, said lamp and translucent section being positioned between said switch and said probe tip.

2. The improvement as defined in claim 1, wherein said tester includes a sound source which is activated when said lamp is activated.

3. The improvement as defined in claim 1, wherein light emitted by said lamp and transmitted by said translucent section is visible for 360° around a longitudinal axis of said tester.

* * * * *